United States Patent

Mei

(10) Patent No.: US 12,262,529 B2
(45) Date of Patent: Mar. 25, 2025

(54) SEMICONDUCTOR DEVICE, MANUFACTURING METHOD OF SEMICONDUCTOR DEVICE, AND SEMICONDUCTOR MEMORY DEVICE

(71) Applicant: CHANGXIN MEMORY TECHNOLOGIES, INC., Hefei (CN)

(72) Inventor: Xiaobo Mei, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 565 days.

(21) Appl. No.: 17/647,632

(22) Filed: Jan. 11, 2022

(65) Prior Publication Data

US 2023/0053178 A1  Feb. 16, 2023

Related U.S. Application Data

(63) Continuation of application No. PCT/CN2021/113316, filed on Aug. 18, 2021.

(30) Foreign Application Priority Data

Aug. 16, 2021  (CN) .......................... 202110934967.7

(51) Int. Cl.
*H10B 12/00* (2023.01)
(52) U.S. Cl.
CPC .......... *H10B 12/34* (2023.02); *H10B 12/053* (2023.02); *H10B 12/488* (2023.02)
(58) Field of Classification Search
None
See application file for complete search history.

(56) References Cited

U.S. PATENT DOCUMENTS 11,700,724 B2 *  7/2023  Wei ...................... H10B 12/315
                                                                257/296
2011/0027988 A1   2/2011  Hwang
2018/0301456 A1  10/2018  Cho et al.
2019/0296017 A1   9/2019  Cho et al.
2021/0242211 A1   8/2021  Huang
2022/0045067 A1   2/2022  Huang

FOREIGN PATENT DOCUMENTS

| CN | 106298673 A | 1/2017 |
| CN | 108695327 A | 10/2018 |
| CN | 210296374 U | 4/2020 |
| CN | 211555887 U | 9/2020 |
| CN | 112885833 A | 6/2021 |
| EP | 3896724 A1 | 10/2021 |

* cited by examiner

*Primary Examiner* — Hsien Ming Lee
(74) *Attorney, Agent, or Firm* — Syncoda LLC; Feng Ma

(57) ABSTRACT

A semiconductor device includes a semiconductor substrate, a word line trench and a word line structure. The word line trench includes a first word line trench and a second word line trench. The word line structure includes a first word line structure part and a second word line structure part connected to each other. The first word line structure part is formed in the first word line trench, and the second word line structure part is formed in the second word line trench; and the first word line structure part includes an avoidance region, and the top surface of the avoidance region is aligned with the top surface of the second word line structure part, and the avoidance region is provided with insulating material.

13 Claims, 18 Drawing Sheets

SEMICONDUCTOR DEVICE, MANUFACTURING METHOD OF SEMICONDUCTOR DEVICE, AND SEMICONDUCTOR MEMORY DEVICE

CROSS-REFERENCE TO RELATED APPLICATIONS

The present application is a continuation of International Application No. PCT/CN2021/113316 filed on Aug. 18, 2021, which claims priority to Chinese Patent Application No. 202110934967.7 filed on Aug. 16, 2021. The disclosures of the above-referenced applications are incorporated herein by reference in their entirety.

BACKGROUND

Dynamic Random Access Memory (DRAM) is a semiconductor memory device commonly used in computers, and includes multiple semiconductor devices. Each semiconductor device generally includes a capacitor and a transistor. A gate of the transistor is connected to a word line structure, a drain of the transistor is connected to a bit line, and a source of the transistor is connected to the capacitor. Voltage signals on the word line structures can control the transistors to be turned on or off, and then data information stored in the capacitors can be read through the bit lines or written into the capacitors through the bit lines for storage. However, interference between the word line structures affects the performance and reliability of the semiconductor devices.

SUMMARY

The disclosure relates to the field of semiconductor technologies, and particularly, to a semiconductor device, a manufacturing method of the semiconductor device, and a semiconductor memory device.

A first aspect provides a semiconductor device according to some embodiments of the disclosure. The semiconductor device includes: a semiconductor substrate, including: shallow trench isolation (STI) regions and multiple active regions that are arranged at intervals and defined by the shallow trench isolation regions; a word line trenches formed on the semiconductor substrate; herein the word line trench is disposed to intersect with corresponding active regions; the word line trench includes a first word line trench and a second word line trench; the orthographic projection of the first word line trench on the semiconductor substrate is positioned within the orthographic projection of a respective STI region on the semiconductor substrate; and the orthographic projection of the second word line trench on the semiconductor substrate is positioned within the orthographic projection of a respective active region on the semiconductor substrate; and a word line structures embedded in the word line trench; herein the word line structure includes a first word line structure part and a second word line structure part connected to each other; the first word line structure part is formed in the first word line trench, and the second word line structure part is formed in the second word line trench; herein the first word line structure part includes an avoidance region, the top surface of the avoidance region is aligned with the top surface of the second word line structure part, and the avoidance region is provided with insulating material.

A second aspect provides a manufacturing method of a semiconductor device according to some embodiments of the disclosure. The manufacturing method includes: providing a semiconductor substrate; forming shallow trench isolation regions on the semiconductor substrate, and defining, by the shallow trench isolation regions, multiple active regions arranged at intervals; forming a word line trench intersecting with the corresponding active regions on the semiconductor substrate; herein the word line trench includes a first word line trench and a second word line trench; the orthographic projection of the first word line trench on the semiconductor substrate is positioned within the orthographic projection of the respective STI region on the semiconductor substrate; and the orthographic projection of the second word line trench on the semiconductor substrate is positioned within the orthographic projection of the respective active region on the semiconductor substrate; and forming an embedded word line structure in the word line trench; herein the word line structure includes a first word line structure part and a second word line structure part electrically connected to each other; the first word line structure part is formed in the first word line trench, and the second word line structure part is formed in the second word line trench; and the first word line structure part includes an avoidance region, the top surface of the avoidance region is aligned with the top surface of the second word line structure part, and the avoidance region is provided with insulating material.

A third aspect provides a semiconductor memory device according to some embodiments of the disclosure. The semiconductor memory device includes the above mentioned semiconductor device.

DETAILED DESCRIPTION

Figure 1:
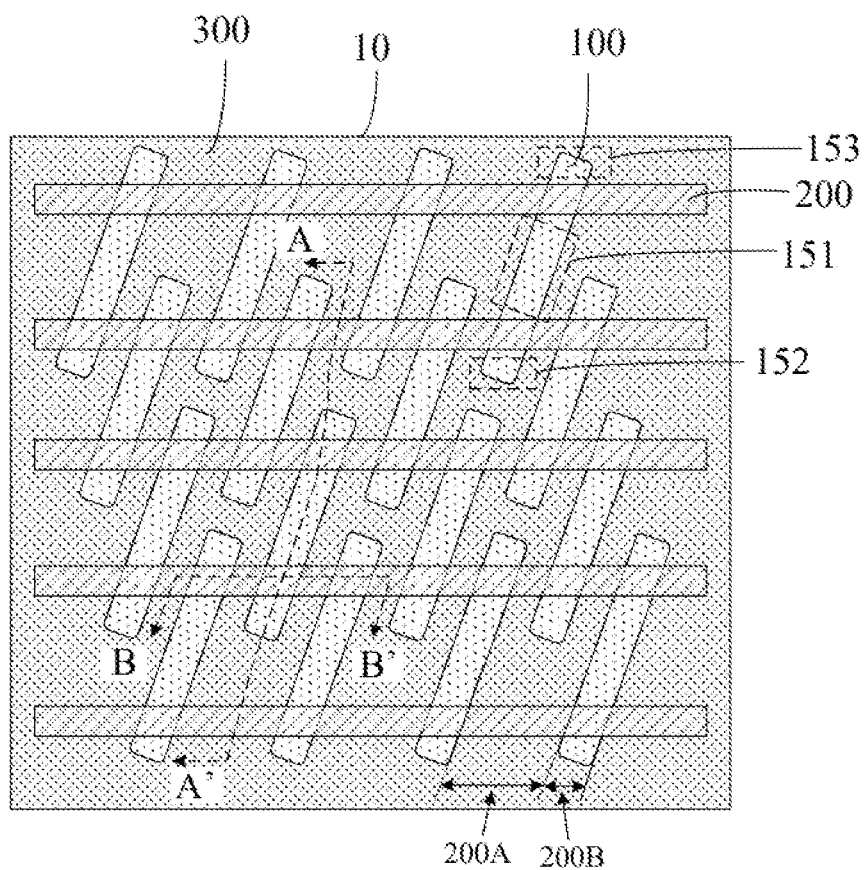
FIG. 1 illustrates a schematic structural diagram from top view of a semiconductor substrate according to an embodiment of the disclosure.

To make the objectives, technical solutions and advantages of the embodiments of the disclosure clearer, the technical solutions of the embodiments of the disclosure will be clearly and completely described below with reference to the drawings of the embodiments of the disclosure. It is to be understood that the described embodiments are only a few embodiments of the disclosure, and not all embodiments. The embodiments of the disclosure and the features in the embodiments may be combined with each other without conflict. All other embodiments, which can be derived by those skilled in the art from the described embodiments of the disclosure without involving any inventive efforts, are within the protection scope of the disclosure.

Unless otherwise defined, the technical terms or scientific terms used herein have the same meaning as commonly understood by those of ordinary skilled in the art to which the disclosure belongs. The terms "first", "second" and the like used in the disclosure are not intended to indicate any order, quantity, or importance, but are used to distinguish one element from another. The word "comprising" or "including", and the like, means that the element or item preceding the word includes the element or item listed after the word and equivalent thereof, but does not exclude other elements or items. The terms "connected" or "coupled" and the like are not limited to physical or mechanical connections, but may include electrical connections, whether direct or indirect.

It is to be understood that the sizes and shapes of the various figures in the drawings do not reflect the true scale, but are merely intended to schematically illustrate the disclosure. Throughout the specification, same reference numerals designate same or similar elements or elements having same or similar functions.

Figure 2A:
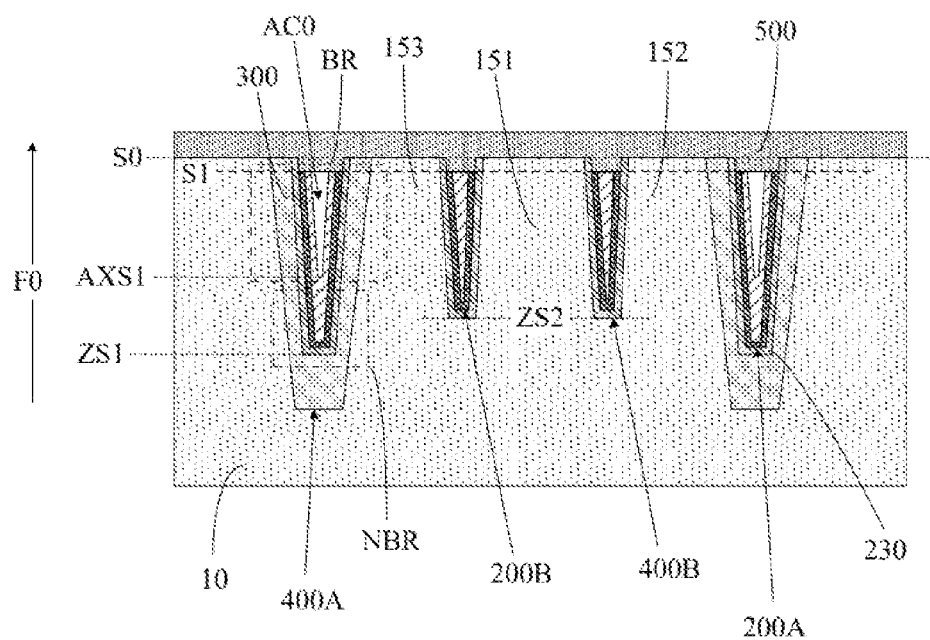
FIG. 2A illustrates a schematic structural diagram from cross-sectional view of the semiconductor substrate taken along the direction AA' of FIG. 1.
Figure 2B:
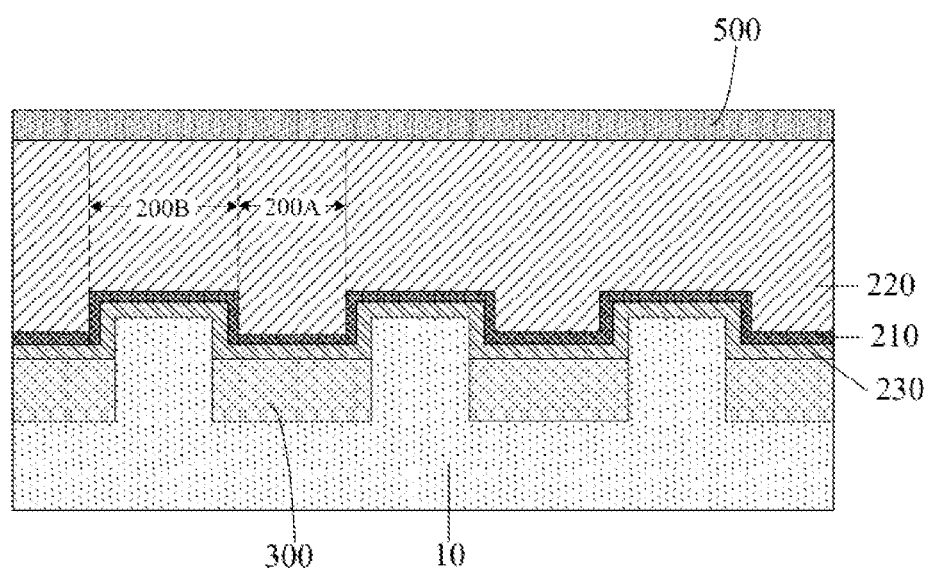
FIG. 2B illustrates a schematic structural diagram from cross-sectional view of the semiconductor substrate taken along the direction BB' of FIG. 1.

With reference to FIGS. 1 to 2B, FIG. 1 illustrates a schematic structural diagram from top view of a semiconductor device according to an embodiment of the disclosure. FIG. 2A illustrates a schematic structural diagram from cross-sectional view of the semiconductor device taken along the direction AA' of FIG. 1. FIG. 2B illustrates a schematic structural diagram from cross-sectional view of the semiconductor device taken along the direction BB' of FIG. 1. The semiconductor device provided by the embodiment of the disclosure includes a semiconductor substrate 10. Illustratively, the material of the semiconductor substrate 10 may include silicon, germanium, or silicon on insulator (SOI) semiconductor, or may include silicon-germanium compounds, silicon carbide, or other known materials, such as a group III or V compound of gallium arsenide. Certain doping ions may further be injected into the semiconductor substrate 10 to change electrical parameters according to design requirements. Illustratively, the semiconductor substrate 10 may be a silicon substrate.

According to an embodiment of the disclosure, a semiconductor substrate 10 may include an array region and a periphery region. The array region may include memory cells, word line structures, and bit lines, and the memory cells include transistors and cylindrical capacitors. The periphery region may include some control circuits, protection circuits (e.g., fuse device), and the like.

According to an embodiment of the disclosure, with reference to FIG. 1 to FIG. 2B, an array region of a semiconductor substrate 10 may include: shallow trench isolation regions 300, and multiple active regions 100 that are arranged at intervals and defined by the STI regions 300. According to the embodiment, the STI regions 300 may include shallow trenches and insulating materials filled in the shallow trenches, the insulating materials are used to isolate shallow trench electric leakage and reduce electrical coupling. The insulating materials filled in the shallow trenches may be silicon oxide, silicon nitride, or the like. The depth of the shallow trenches can be set according to actual application requirements so as to control the isolation degree of transistors.

According to an embodiment of the disclosure, with reference to FIG. 1 to FIG. 2B, an array region of a semiconductor substrate 10 may include: multiple word line trenches formed on the semiconductor substrate 10 and word line structures 200 embedded in word line trenches. Each word line trench is disposed to intersect with corresponding active regions 100 of the word line trenches. That is, the word line structures intersect with the corresponding active regions 100. A word line trench includes a first word line trench 400A and a second word line trench 400B. The orthographic projection of the first word line trench 400A on the semiconductor substrate 10 is positioned within the orthographic projection of the respective STI region 300 on the semiconductor substrate 10; and the orthographic projection of the second word line trench 400B on the semiconductor substrate 10 is positioned within the orthographic projections of the respective active region 100 on the semiconductor substrate 10. The word line structure 200 includes a first word line structure part 200A and a second word line structure part 200B electrically connected to each other. The first word line structure part 200A is formed in the respective first word line trench 400A and the second word line structure part 200B is formed in the respective second word line trench 400B.

It is to be understood that the second word line structure parts 200B directly contacted to the active regions 100 may be used as gates of the corresponding transistors in the memory cells. During or after the formation of the word line structures, a source/drain region in each active region 100, such as the source/drain region 151 between two word line structures, may be used as a source of a corresponding transistor; and another source/drain region, such as source/drain regions 152 and 153 between a word line structure and the STI region 300, may serve as drains of a corresponding transistor.

According to an embodiment of the disclosure, with reference to FIGS. 1 to 2B, each first word line structure part 200A includes an avoidance region BR, the top surface of the avoidance regions BR is aligned with the top surface of second word line structure parts 200B (i.e., the top surface of the avoidance regions BR and the top surface of the second word line structure parts 200B are aligned with a plane S0), and the avoidance regions BR are provided with insulating material 500. Thus, in the case that it is possible to enable the first word line structure parts 200A and the second word line structure parts 200B to implement current flow, by providing the avoidance regions BR in the first word line structure parts 200A, the electric charges may be made to be substantially concentrated in non-avoidance regions NBR of the first word line structure parts 200A, and the electric charges in the avoidance regions BR of the first word line structure parts 200A are reduced, so that the coupling electric field between the avoidance region BR of a first word line structure part 200A and the second word line structure part 200B of an adjacent word line structure is reduced, and further, the interference between the word line structures is reduced, and the performance and reliability of a semiconductor device are improved.

According to an embodiment of the disclosure, with reference to FIG. 1 to FIG. 2B, the depth of first word line trench 400A is greater than the depth of the second word line trench 400B in the direction F0 perpendicular to a plane on which a semiconductor substrate 10 is located. Illustratively, the top surface of the first word line trench 400A is aligned with the top surface of the second word line trench 400B. That is, the top surface of the first word line trench 400A and the top surface of the second word line trench 400B are aligned with a plane S0. The plane S0 may be a plane on which the top surface of the active region 100 of a semiconductor substrate 10 is positioned. In practical application, the specific value of the depth of the first word line trench 400A and the depth of the second word line trench 400B may be designed according to the practical application requirements, and are not limited herein.

According to an embodiment of the disclosure, with reference to FIGS. 1 to 2B, in the extension direction of the word line structures, the boundary of a first word line trench 400A overlaps with the boundary of a second word line trench 400B in the same word line trench. In the extension direction of the word line structures, the boundary of a first word line structure part 200A overlaps with the boundary of a second word line structure part 200B in a same word line structure.

According to an embodiment of the disclosure, with reference to FIGS. 1 to 2B, a second word line structure part 200B is a solid structure. The cross section of a first word line structure part 200A includes a concave region AC0 in the direction perpendicular to the extension direction of word line structures. That is, the groove is dug into the first word line structure part 200A in the direction perpendicular to a semiconductor substrate 10 to form groove in the first word line structure part 200A. Illustratively, the concave region AC0 may be avoidance region BR. The groove is formed in the first word line structure part 200A, so that electric charges are mainly concentrated at the bottoms of the groove, and relatively few charges are on the side walls of the groove, so that the coupling electric field between the side wall of the groove of a first word line structure part 200A and the second word line structure part 200B of adjacent word line structure is reduced, the interference between the word line structures is reduced, and the performance and the reliability of a semiconductor device are improved.

According to an embodiment of the disclosure, with reference to FIG. 1 to FIG. 2B, in the direction F0 perpendicular to a semiconductor substrate 10, the top surface of concave region AC0 is aligned with the top surface of second word line structure part 200B. That is, the top surface of the concave region AC0 and the top surface of second word line structure part 200B are aligned with a plane S1. That is, in the direction F0 perpendicular to the semiconductor substrate 10, the plane S1 is lower than a plane S0, or the distance between the plane S1 and the bottom surface of the semiconductor substrate 10 (i.e., the side, away from the side in which word line trenches are disposed, of the semiconductor substrate 10) is smaller than the distance between the plane S0 and the bottom surface of the semiconductor substrate 10 (i.e., the side, away from the side in which the word line trenches are disposed, of the semiconductor substrate 10).

According to an embodiment of the disclosure, with reference to FIG. 1 to FIG. 2B, in the direction F0 perpendicular to a semiconductor substrate 10, the bottom surface AXS1 of concave region AC0 is higher than the bottom surface ZS2 of second word line structure part 200B, and the bottom surface ZS1 of first word line structure part 200A is lower than the bottom surface ZS2 of the second word line structure part 200B. That is, the distance between the bottom surface AXS1 of the concave region AC0 and the bottom surface of the semiconductor substrate 10 is greater than the distance between the bottom surface ZS2 of the second word line structure part 200B and the bottom surface of the semiconductor substrate 10, and the distance between the bottom surface ZS1 of the first word line structure part 200A and the bottom surface of the semiconductor substrate 10 is smaller than the distance between the bottom surface ZS2 of the second word line structure part 200B and the bottom surface of the semiconductor substrate 10. Thus, the first word line structure part 200A and the second word line structure part 200B in the same word line structure may be better electrically connected for signal transmission. Electric charges are concentrated at the bottoms of grooves of the first word line structure parts 200A, and the facing areas between the bottoms of the groove of the first word line structure part 200A and the second word line structure part 200B of the adjacent word line structure are as low as possible, so that the coupling electric field between the bottom of the groove of the first word line structure part 200A and the second word line structure part 200B of adjacent word line structure can be reduced as much as possible, the interference between the word line structures is further reduced, and the performance and the reliability of a semiconductor device are improved.

According to an embodiment of the disclosure, with reference to FIG. 1 to FIG. 2B, the word line structure may include: a gate oxide layer 230 and word lines. The gate oxide layer 230 covers the side wall of the word line trench; and the gate oxide layer 230 is positioned between the word lines and the word line trench. Illustratively, the gate oxide layer 230 in contact with second word line structure part 200B is in direct contact with a semiconductor substrate 10.

An STI layer 300 is disposed between the gate oxide layer 230 in contact with the first word line structure parts 200A and the semiconductor substrate 10.

According to an embodiment of the disclosure, with reference to FIGS. 1 to 2B, a concave region AC0 may be positioned within the word line in first word line structure part 200A. Illustratively, the word lines include a first conductive film layer 210 and a second conductive film layer 220. The first conductive film layer 210 is disposed on the side wall of word line trench, and the first conductive film layer 210 is positioned between the second conductive film layer 220 and gate oxide layer 230. Illustratively, the concave region AC0 may be positioned in the second conductive film layer 220 in the first word line structure part 200A. For example, during manufacturing, the second conductive film layer 220 in the first word line structure part 200A may be vapor phase etched to form the concave regions AC0 in the second conductive film layer 220 in the first word line structure part 200A as avoidance region BR.

According to an embodiment of the disclosure, with reference to FIG. 1 to FIG. 2B, the insulating material 500 in avoidance regions BR may be air. Illustratively, an air gap process may be adopted to form air gaps in first word line structure parts 200A.

A semiconductor device illustrated in FIGS. 1 to 2B is taken as an example, with reference to FIG. 3A to FIG. 3J, which illustrate schematic structural diagrams from cross-sectional view of the semiconductor device according to embodiments of the disclosure during a manufacturing process of the semiconductor device.

Figure 7:
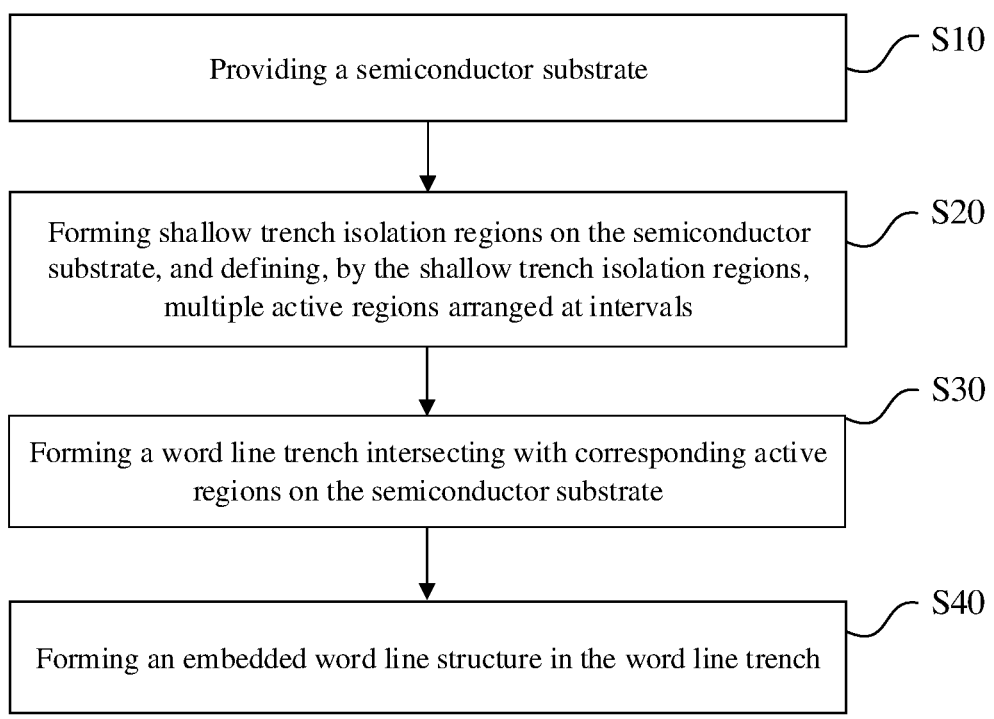
FIG. 7 illustrates a manufacturing method of a semiconductor device according to an embodiment of the disclosure.

Referring to FIG. 7, the manufacturing method provided by the embodiments of the disclosure may include steps S10 to S40.

At S10, a semiconductor substrate 10 is provided.

Illustratively, the material of the semiconductor substrate 10 may include silicon, germanium, or SOI semiconductor, or may include silicon-germanium compounds, silicon carbide, or other known materials, such as group III and V compound of gallium arsenide. Certain doping ions may further be injected into the semiconductor substrate 10 to change electrical parameters according to design requirements. Illustratively, the semiconductor substrate 10 may be a silicon substrate.

At S20, the STI regions 300 are formed on the semiconductor substrate 10, and the STI regions 300 define multiple active regions 100 that are arranged at intervals.

Figure 3A:
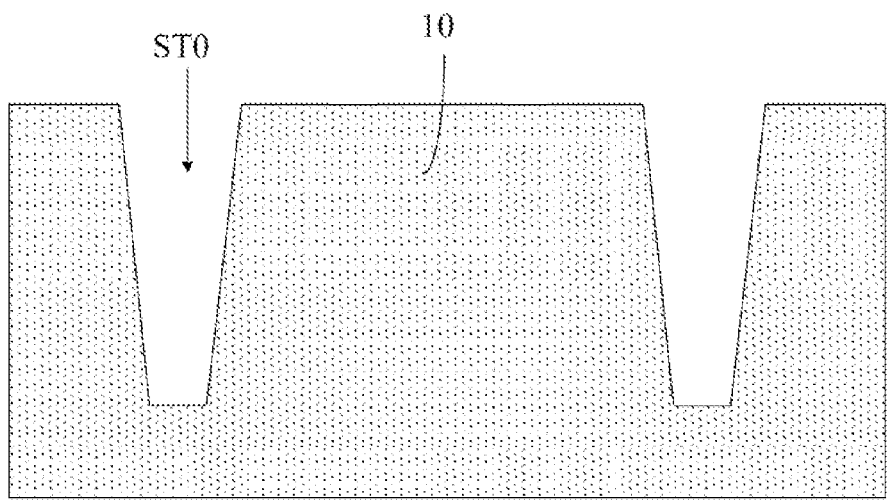
FIG. 3A illustrates a schematic structural diagram from cross-sectional view of a semiconductor device according to an embodiment of the disclosure during a manufacturing process of the semiconductor device.

Illustratively, step S20 may specifically include the steps, for example that: an STI mask is formed on the semiconductor substrate 10, and regions of the semiconductor substrate 10 covered by the STI mask are active regions 100. Then, the STI mask is used as an etching mask, and a vapor phase etching process is adopted, and etching gas may be one or more of SF6, CF4, Cl2, CHF3, O2 or Ar, so as to achieve a certain etching selection ratio. The exposed semiconductor substrate 10 is etched to form STI trenches, so that regions of the semiconductor substrate 10 in which the active regions 100 are to be formed are reserved. Thereafter, the STI mask is removed, and the semiconductor substrate 10 with the STI trenches ST0 illustrated in FIG. 3A is formed.

Figure 3B:
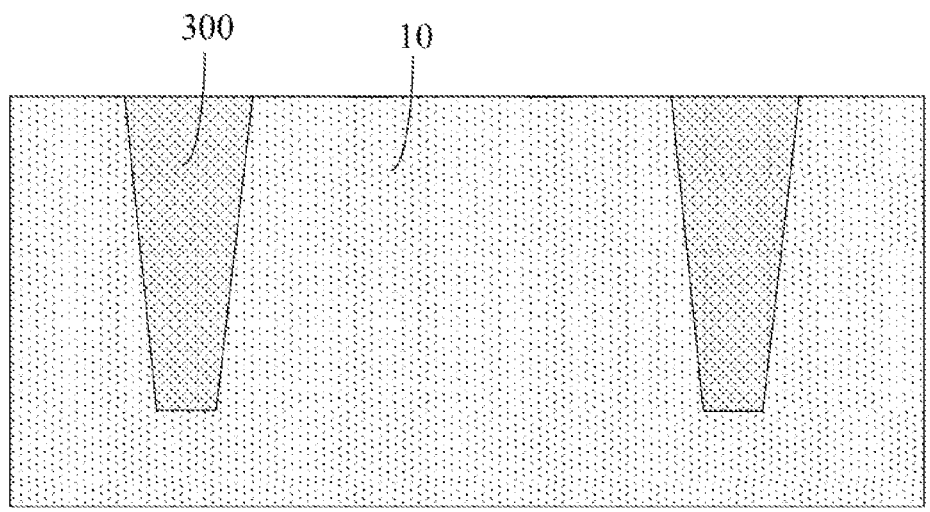
FIG. 3B illustrates another schematic structural diagram from cross-sectional view of a semiconductor device according to an embodiment of the disclosure during a manufacturing process of the semiconductor device.
Figure 3C:
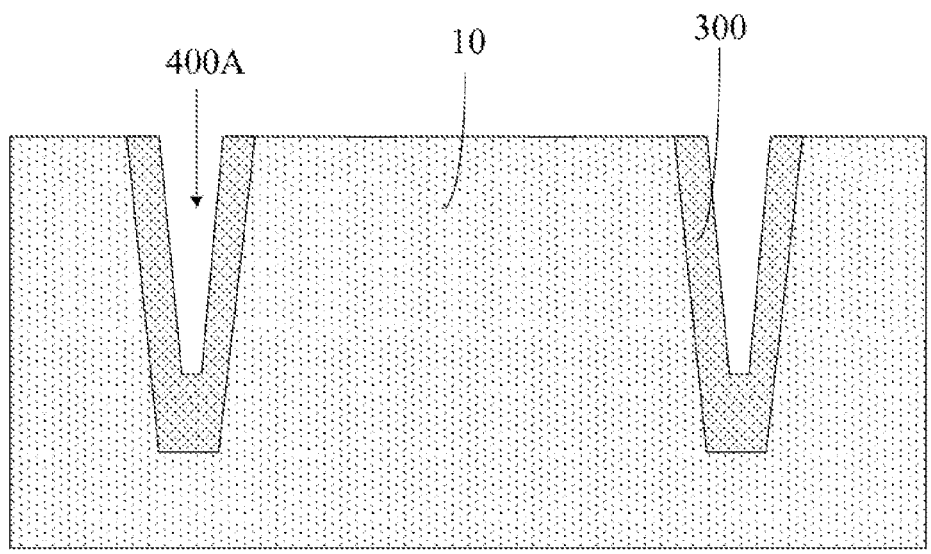
FIG. 3C illustrates another schematic structural diagram from cross-sectional view of a semiconductor device according to an embodiment of the disclosure during a manufacturing process of the semiconductor device.
Figure 3D:
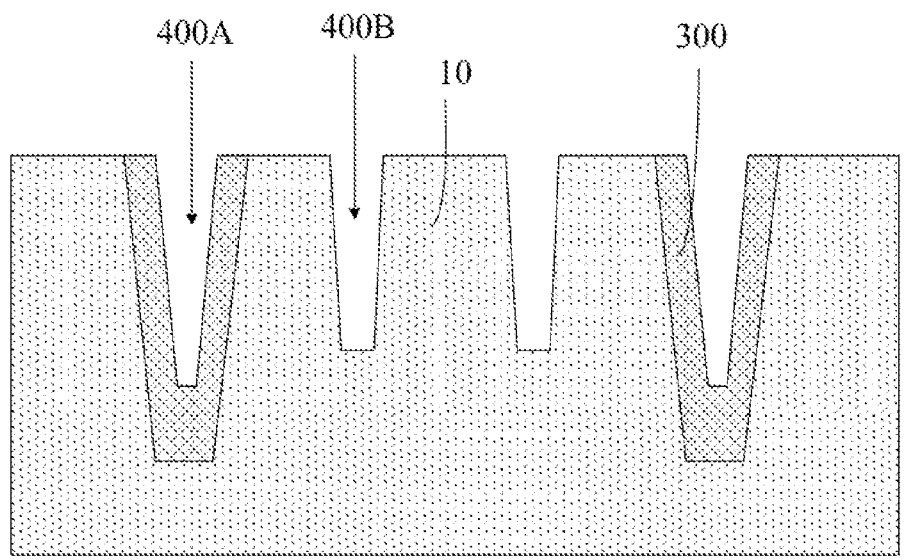
FIG. 3D illustrates another schematic structural diagram from cross-sectional view of a semiconductor device according to an embodiment of the disclosure during a manufacturing process of the semiconductor device.
Figure 3E:
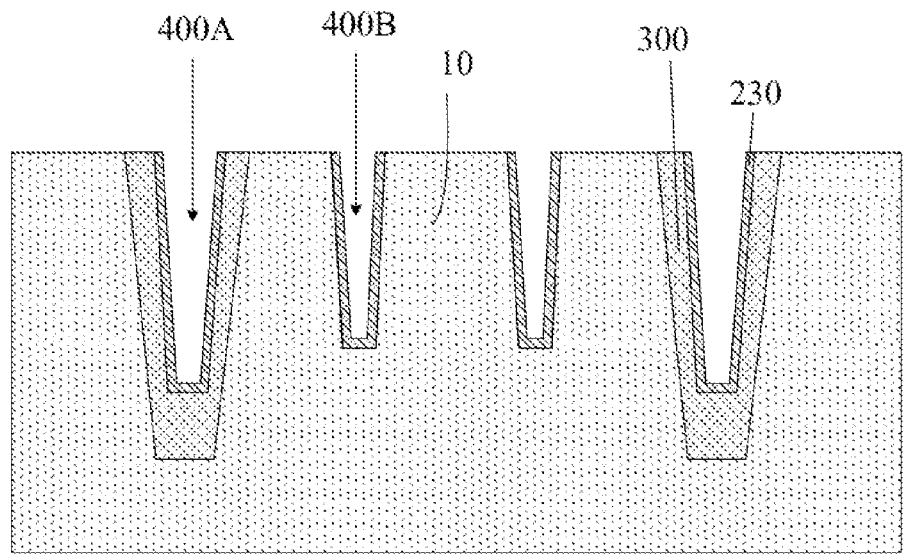
FIG. 3E illustrates another schematic structural diagram from cross-sectional view of a semiconductor device according to an embodiment of the disclosure during a manufacturing process of the semiconductor device.
Figure 3F:
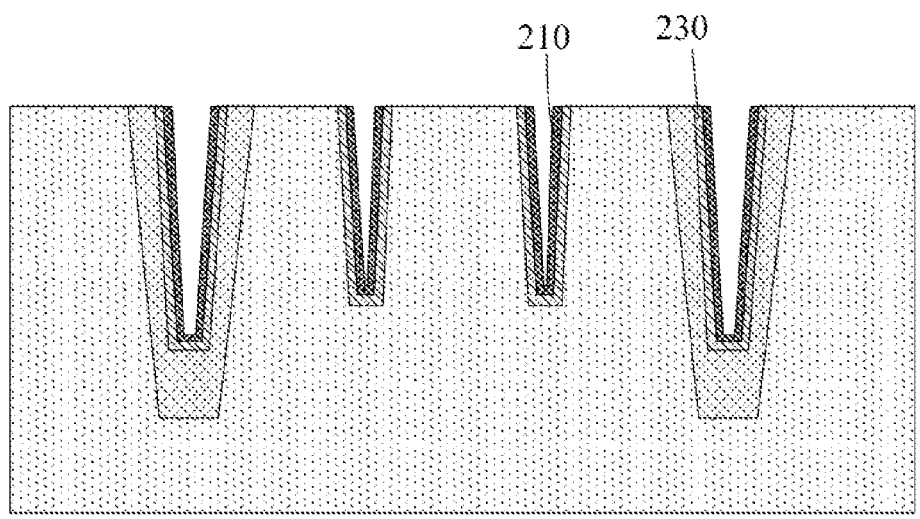
FIG. 3F illustrates another schematic structural diagram from cross-sectional view of a semiconductor device according to an embodiment of the disclosure during a manufacturing process of the semiconductor device.
Figure 3G:
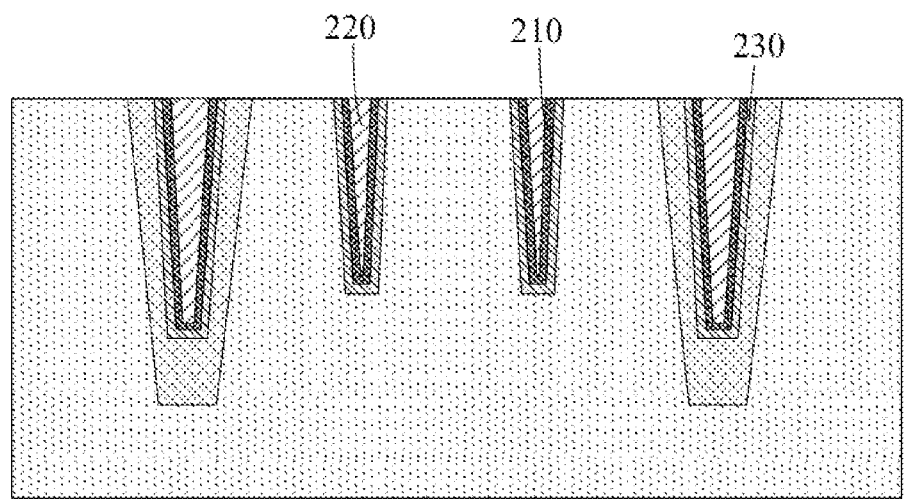
FIG. 3G illustrates another schematic structural diagram from cross-sectional view of a semiconductor device according to an embodiment of the disclosure during a manufacturing process of the semiconductor device.
Figure 3H:
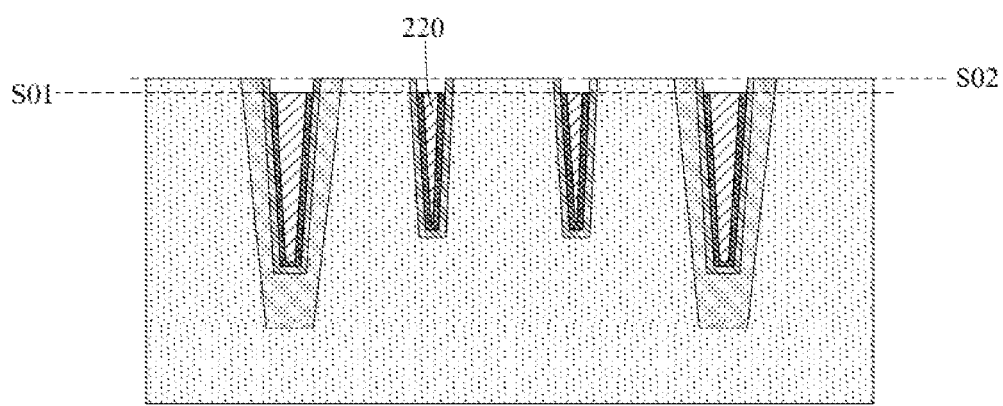
FIG. 3H illustrates another schematic structural diagram from cross-sectional view of a semiconductor device according to an embodiment of the disclosure during a manufacturing process of the semiconductor device.
Figure 3I:
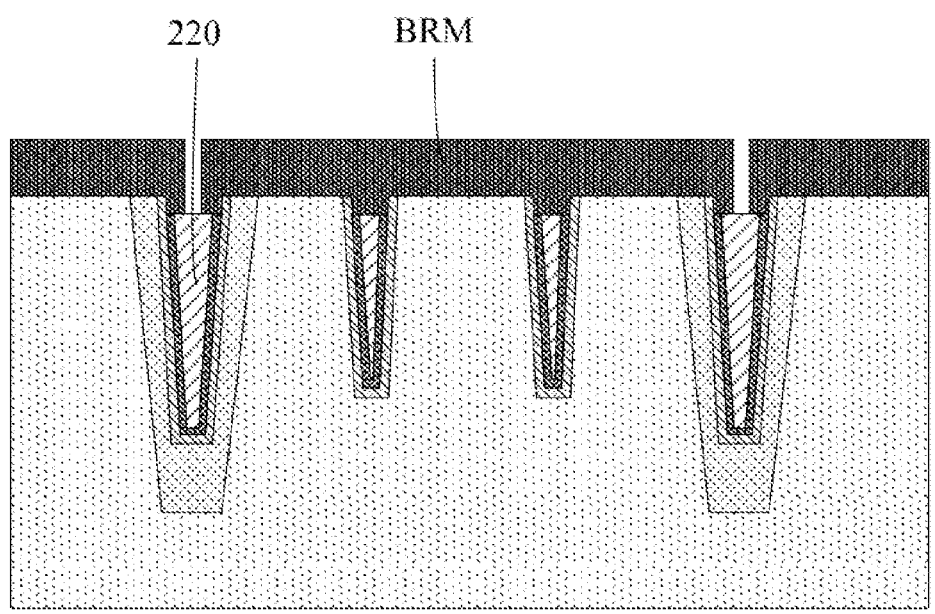
FIG. 3I illustrates another schematic structural diagram from cross-sectional view of a semiconductor device according to an embodiment of the disclosure during a manufacturing process of the semiconductor device.
Figure 3J:
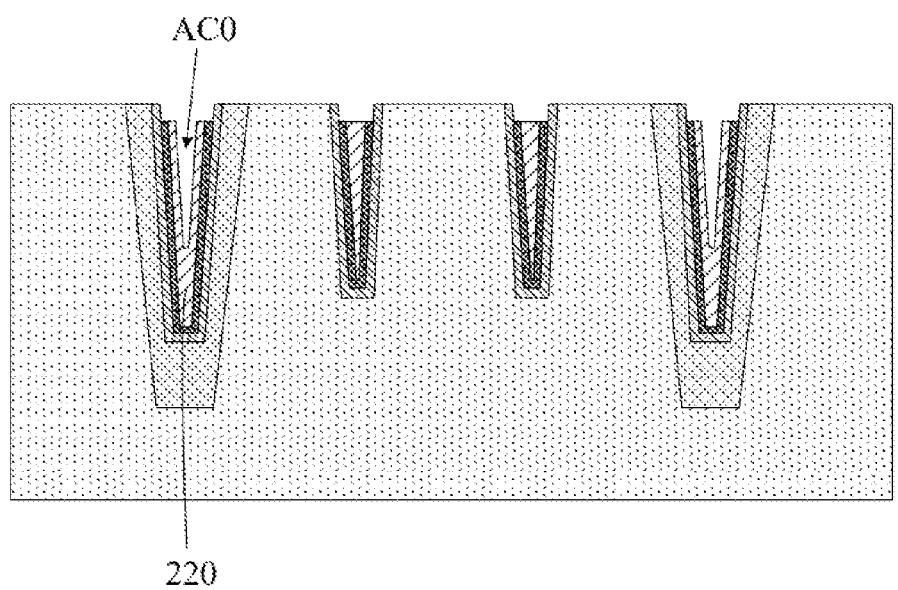
FIG. 3J illustrates another schematic structural diagram from cross-sectional view of a semiconductor device according to an embodiment of the disclosure during a manufacturing process of the semiconductor device.

Thereafter, with reference to FIG. 3B, the SiN is filled in the STI trenches ST0 as STI layer 300, then the STI regions 300 are formed, and multiple active regions 100 are defined on the semiconductor substrate 10 by the STI regions 300.

At S30, a word line trench intersecting with the corresponding active regions 100 is formed on the semiconductor substrate 10.

According to an embodiment of the disclosure, step S30, for example, may specifically include the following steps.

Firstly, a photoetching process and an etching process may be adopted to form first word line trenches 400A in the STI regions 300. For example, the photoetching process is used to form a mask for first word line trenches 400A, which exposes the regions of the STI regions 300 in which the first word line trenches 400A are to be formed. The mask for the first word line trenches 400A is used as an etching mask and a vapor phase etching process is adopted, and etching gas may be one or more of SF6, CF4, Cl2, CHF3, O2, or Ar, so as to achieve a certain etching selection ratio. The exposed SiN in the STI regions 300 is etched, so as to form the first word line trenches 400A in the SiN in the STI regions 300. Thereafter, the mask for the first word line trenches 400A is removed by vapor phase etching, thereby forming the structure of the semiconductor device illustrated in FIG. 3C, i.e., forming the first word line trenches 400A in SiN in the STI regions 300.

Thereafter, a photoetching process and an etching process may be used to form second word line trenches 400B in active regions 100. For example, the photoetching process is used to form a mask for the second word line trenches 400B, which exposes the regions of the active regions 100 on the semiconductor substrate in which the second word line trenches 400B are to be formed. The mask for the second word line trenches 400B is used as an etching mask and a vapor phase etching process is adopted, and etching gas may be one or more of SF6, CF4, Cl2, CHF3, O2, or Ar, so as to achieve a certain etching selection ratio. The exposed active regions are etched, so as to form the second word line trenches 400B in the active regions 100. Thereafter, the mask for the second word line trenches 400B is removed by vapor phase etching, thereby forming the structure of the semiconductor device illustrated in FIG. 3D, i.e., forming the second word line trenches 400B in the active regions 100.

It is to be understood that, the first word line trenches 400A and the second word line trenches 400B in the same word line trench are alternately arranged in the extension direction of the word line structures.

At S40, an embedded word line structure is formed in the word line trench.

According to an embodiment of the disclosure, step S40, for example, may specifically include the following steps.

Firstly, a gate oxide layer 230 may cover on side walls of the word line trenches. Exemplarily, with reference to FIG. 3E, the gate oxide layer 230 is formed on the side walls of the word line trenches. For example, the material of the gate oxide layer 230 may include one or more of silicon oxide, silicon nitride, oxynitride, silicon nitride, or oxide/nitride/oxide (ONO). The gate oxide layer 230 may be formed by, for example, a wet or dry-hot oxidation process in an environment including oxide, water vapor, nitric oxide, or a combination thereof, or by an In Situ Steam Generation (ISSG) process in an environment including oxygen, water vapor, nitric oxide, or a combination thereof, or by a Chemical Vapor Deposition (CVD) technique using Tetraethoxysilane (TEOS) and oxygen as precursors.

Thereafter, the word line trenches in which the gate oxide layer 230 is formed may be filled with conductive materials to form initial word line structures. Exemplarily, the material of the word line structures may include one or more of Ti, TiN, Ta, TaN, W, WN, TiSiN, or WSiN. Exemplarily, the word line structures may adopt a single layer structure. For example, the word line structures are formed by using one of Ti, TiN, Ta, TaN, W, WN, TiSiN, or WSiN. Alternatively, the word line structures may adopt a stacked structure. For example, with reference to FIG. 3F, a TiN layer 210 is deposited on the side walls in the word line trenches with the gate oxide layer 230 at a set deposition rate to serve as the first conductive film layer 210 in the word line structures, Thereafter, with reference to FIG. 3G, a W layer 220 is deposited in the word line trenches with the TiN layer 210 at a set deposition rate to serve as the second conductive film layer 220 in the word line structures. The first conductive film layer 210 is positioned between the second conductive film layer 220 and the gate oxide layer 230, which may enable the TiN layer 210 and the W layer 220 to be used as a whole to form the initial word line structures. It is to be understood that, the foregoing deposition manner may be selected by those skilled in the art from chemical vapor deposition (CVD), physical vapor deposition (PVD), atomic layer deposition (ALD), high-density plasma chemical vapor deposition (HDPCVD), metal organic chemical vapor deposition, plasma enhanced chemical vapor deposition or other suitable deposition processes, and the disclosure is not limited thereto, and the deposition rate may be designed and determined according to the practical application requirements, and is not limited herein;

Thereafter, the initial word line structure is etched such that the top surface of the initial word line structure is lower than the top surface of the semiconductor substrate 10, so as to form the second word line structure part 200B and the first initial word line structure part in the first word line trench 400A. Illustratively, with reference to FIG. 3H, a vapor phase etching process may be adopted, and etching gas may be one or more of SF6, CF4, Cl2, CHF3, O2 or Ar to achieve a certain etching selection ratio, and the initial word line structures are etched such that the top surface S01 of the initial word line structure is lower than the top surface S02 of the semiconductor substrate 10, so that the word line structure embedded in the semiconductor substrate 10 may be formed.

Thereafter, the first initial word line structure part is etched to form avoidance region BR in the first initial word line structure part, so as to form the first word line structure part 200A. Illustratively, the first initial word line structure part may be etched by using a photoetching process and an etching process, so that the avoidance region BR is formed in the first initial word line structure part to form the first word line structure part 200A. For example, with reference to FIG. 3I, the photoetching process is adopted to form an avoidance mask BRM, which exposes the portions of the first initial word line structure part in which the avoidance region BR are to be formed. Then, with reference to FIG. 3J, the avoidance mask BRM is used as an etching mask, a vapor phase etching process is adopted, and etching gas may be one or more of SF6, CF4, Cl2, CHF3, O2 or Ar, so as to achieve a certain etching selection ratio. The exposed W layer in the first initial word line structure parts are subjected to vapor phase etching, so as to form concave regions AC0 in the W layers of the first initial word line structure parts to serve as avoidance regions BR.

After step S40, an insulating barrier layer covering the entire semiconductor device may be formed and the avoidance regions BR may be filled with insulating materials 500. Illustratively, with reference to FIG. 2A, an air gap forming process may be adopted to form air gaps in the avoidance regions BR of the first word line structure parts 200A while forming the insulating barrier layer covering the entire semiconductor device. Illustratively, the material of the insulating barrier layer may include one or more of silicon oxide, silicon nitride, oxynitride, silicon nitride, or ONO. For example, the air gap forming process may be adopted to form the air gaps in the avoidance regions BR of the first word line structure parts 200A while forming a SiN layer as the insulating barrier layer covering the entire semiconductor device.

It is to be understood that, in the actual manufacturing process, due to the limitation of the process conditions or other factors, the foregoing "aligned" may not be completely "aligned", and there may be some deviations, so that the foregoing aligned relationship only needs to substantially satisfy the foregoing conditions, which falls within the protection scope of the disclosure. For example, the foregoing "aligned" may be "aligned" within the allowed range.

Figure 4A:
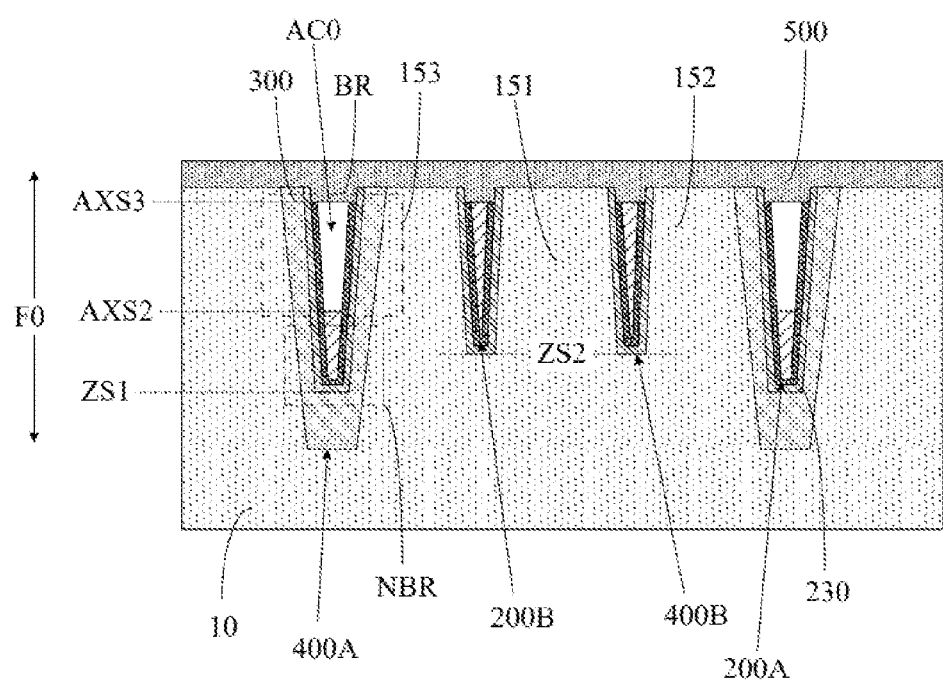
FIG. 4A illustrates another schematic structural diagram from cross-sectional view of the semiconductor substrate taken along the direction AA' of FIG. 1.
Figure 4B:
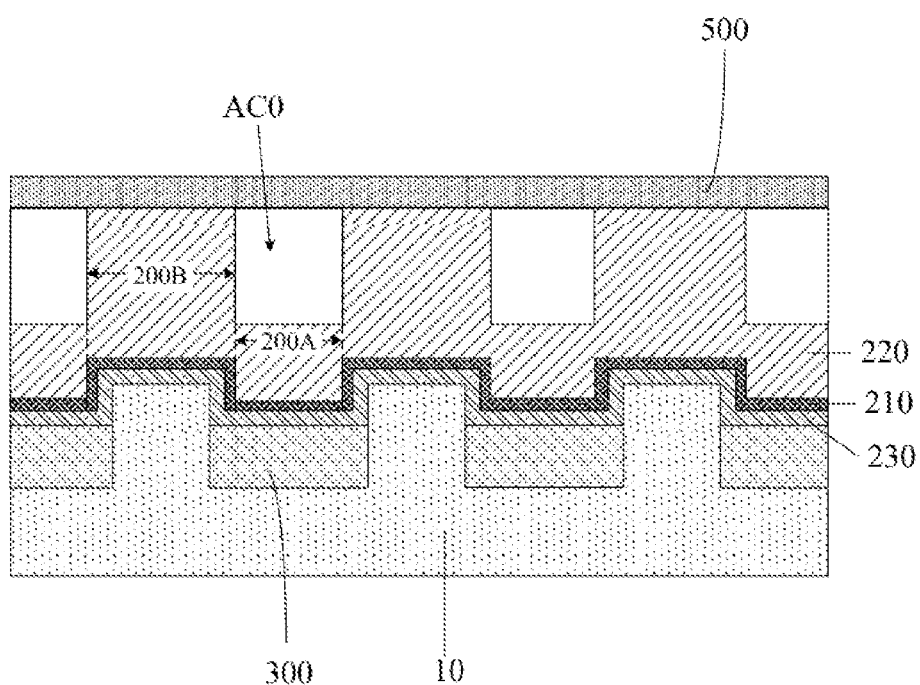
FIG. 4B illustrates another schematic structural diagram from cross-sectional view of the semiconductor substrate taken along the direction BB' of FIG. 1.

An embodiment of the disclosure provides schematic structural diagrams of another semiconductor device, as illustrated in FIG. 4A and FIG. 4B, which modifies the implementations according to the foregoing embodiments. Only the differences between the present embodiment and the foregoing embodiments will be described below, and the same parts will not be elaborated herein.

With reference to FIG. 4A and FIG. 4B, FIG. 4A illustrates another schematic structural diagram from cross-sectional view of the semiconductor substrate taken along the direction AA' of FIG. 1; and FIG. 4B illustrates another schematic structural diagram from cross-sectional view of the semiconductor substrate taken along the direction BB' of FIG. 1. According to the embodiment of the disclosure, in the manufacturing method, the first initial word line structure parts are etched to form avoidance regions BR in the first initial word line structure parts, so that the first word line structure parts 200A are formed. Illustratively, when the word line structures adopt, for example, a stacked structure of a TiN layer 210 and a W layer 220, after forming the W layer in word line trenches with the TiN layer, the W layer formed in the first word line trenches 400A may be vapor phase etched to partially remove the W layer by a certain distance (which may be designed and determined according to actual application), so that the W layer in the first word line trenches 400A is solid structure, and thus the remaining W layer and the TiN layer may form concave regions AC0. The W layer in the first word line trenches 400A and the TiN layer below the W layer serve as the bottoms of the concave regions AC0, and the TiN layer on the word line trench side walls serve as the side walls of the concave regions AC0. It is to be understood that the rest steps of the manufacturing method of the semiconductor device according to the embodiment are substantially the same as those in the foregoing manufacturing method, and will not be elaborated herein.

According to the embodiment of the disclosure, as illustrated in FIG. 4A and FIG. 4B, the second conductive film layer 220 (e.g., W layer) in the first word line structure part 200A is solid structure. In the first word line structure part 200A, the top surface AXS2 of the second conductive film layer 220 (e.g., W layer) is lower than the top surface AXS3 of first conductive film layer 210 (e.g., TiN layer), and the second conductive film layer 220 (e.g., W layer) serves as the bottom of the concave region AC0, and the first conductive film layer 210 (e.g., TiN layer) disposed on the side wall of the word line trench serves as the side wall of the concave region AC0.

Figure 5:
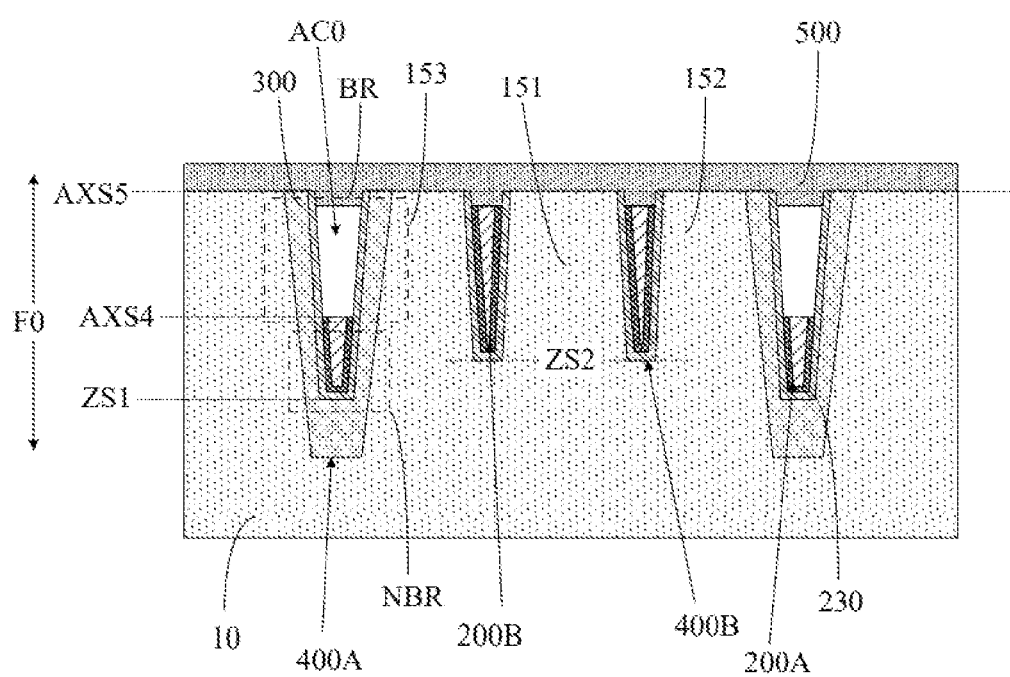
FIG. 5 illustrates another schematic structural diagram from cross-sectional view of the semiconductor substrate taken along the direction AA' of FIG. 1.

An embodiment of the disclosure provides a schematic structural diagram of another semiconductor device, as illustrated in FIG. 5, which modifies the implementations according to the foregoing embodiments. Only the differences between the present embodiment and the foregoing embodiments will be described below, and the same parts will not be elaborated herein.

With reference to FIG. 5, FIG. 5 illustrates another schematic structural diagram from cross-sectional view of the semiconductor substrate taken along the direction AA' of FIG. 1. According to the embodiment of the disclosure, in the manufacturing method, first initial word line structure parts are etched to form avoidance regions BR in the first initial word line structure parts, so that the first word line structure parts 200A are formed. Illustratively, when the word line structures adopt, for example, a stacked structure of a TiN layer 210 and a W layer 220, after the W layer is formed in the word line trenches provided having the TiN layer, the W layer and the TiN layer formed in the first word line trenches 400A may be subjected to vapor phase etching to partially remove the W layer and the TiN layer by a certain distance (which may be designed and determined according to practical application), so that the W layer and the TiN layer in the first word line trenches 400A are used as a whole to form solid structures, and thus the remaining W layer, the TiN layer and gate oxide layer 230 may form concave regions AC0. The W layer in the first word line trenches 400A and the TiN layer below the W layer may serve as the bottoms of the concave regions AC0, and the gate oxide layer 230 on the side walls of the word line trenches may serve as side walls of the concave regions. It is to be understood that the rest steps of the manufacturing method of the semiconductor device according to the embodiment are substantially the same as those in the foregoing manufacturing method, and will not be elaborated herein.

According to the embodiment of the disclosure, as illustrated in FIG. 5, the top surface AXS2 of the W layer 220 in the first word line structure part 200A may be higher than the bottom surface of the TiN layer in the second word line structure part 200B, and the bottom surface of the TiN layer in the first word line structure part 200A may be lower than the bottom surface of the TiN layer in the second word line structure part 200B.

According to the embodiment of the disclosure, as illustrated in FIG. 5, word line in the first word line structure part 200A is solid structure. In the first word line structure part 200A, the top surface AXS4 of the word line is lower than the top surface AXS5 of the gate oxide layer 230 (e.g., may be an S0 plane). In the first word line structure part 200A, the word line serves as the bottom of the concave region AC0, and the gate oxide layer 230 disposed on the side wall of the word line trench serve as the side wall of the concave region AC0.

Figure 6:
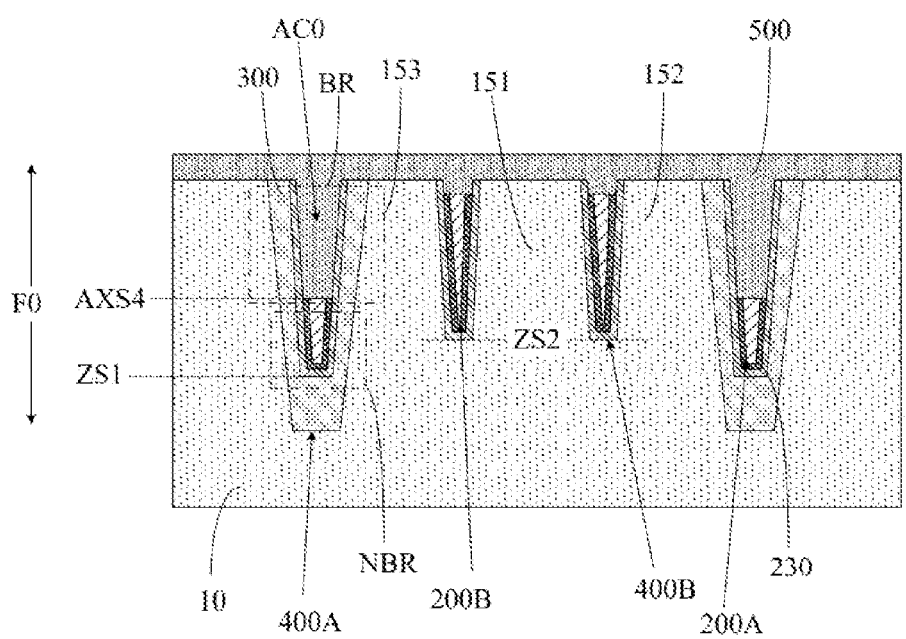
FIG. 6 illustrates another schematic structural diagram from cross-sectional view of the semiconductor substrate taken along the direction BB' of FIG. 1.

An embodiment of the disclosure provides a schematic structural diagram of another semiconductor device, as illustrated in FIG. 6, which modifies the implementations according to the foregoing embodiments. Only the differences between the present embodiment and the foregoing embodiments will be described below, and the same parts will not be elaborated herein.

According to the embodiment of the disclosure, as illustrated in FIG. 6, insulating material 500 in avoidance regions BR may further be inorganic insulating material. Illustratively, the inorganic insulating material may include one or more of silicon oxide, silicon nitride, oxynitride, silicon nitride, or ONO.

With reference to FIG. 6, FIG. 6 illustrates another schematic structural diagram from cross-sectional view of the semiconductor substrate taken along the direction BB' of FIG. 1. According to the embodiment of the disclosure, in the manufacturing method, a SiN layer is deposited on the entire semiconductor device at a set deposition rate as an insulating barrier layer, and meanwhile the SiN layer is deposited and filled in avoidance regions BR of first word line structure parts 200A. It is to be understood that the rest steps of the manufacturing method of the semiconductor device according to the embodiment are substantially the same as those in the foregoing manufacturing method, and will not be elaborated herein.

An embodiment of the disclosure further provides a semiconductor memory device. The semiconductor memory device may include the semiconductor device provided by the embodiments of the disclosure. The principle of the semiconductor memory device for solving the problems is similar to that of the above mentioned semiconductor device, and therefore the implementations of the semiconductor memory device may be referred to the above mentioned implementations of the semiconductor device, and the repeated parts are not elaborated herein.

In specific implementations according to embodiments of the disclosure, the semiconductor device is, for example, a DRAM. The semiconductor memory device may include the semiconductor device. The semiconductor memory device may be a product or a component with a memory function. Those skilled in the art should understand that other essential components of the semiconductor memory device are included, and will not be elaborated herein, which should not be construed as limiting the disclosure.

It is apparent to those skilled in the art that variations and modifications may be made to the disclosure without departing from the spirit and scope of the disclosure. Thus, the disclosure is intended to further include such modifications and variations falling within the scope of the claims and equivalents thereof.

What is claimed is:

1. A semiconductor device, comprising:
  a semiconductor substrate, comprising: shallow trench isolation regions, and multiple active regions that are arranged at intervals and defined by the shallow trench isolation regions;
  a word line trench formed on the semiconductor substrate, the word line trench being disposed to intersect with corresponding active regions; wherein the word line trench comprises a first word line trench and a second word line trench; an orthographic projection of the first word line trench on the semiconductor substrate is positioned within an orthographic projection of a respective shallow trench isolation region on the semiconductor substrate; and an orthographic projection of the second word line trench on the semiconductor substrate is positioned within an orthographic projection of a respective active region on the semiconductor substrate; and
  a word line structure embedded in the word line trench; wherein the word line structure comprises a first word line structure part and a second word line structure part connected to each other; the first word line structure part is formed in the first word line trench, and the second word line structure part is formed in the second word line trench;
  wherein the first word line structure part comprises an avoidance region, a top surface of the avoidance region is aligned with a top surface of the second word line structure part, and the avoidance region is provided with insulating material;
  wherein the second word line structure part is a solid structure; a cross section of the first word line structure part comprises a concave region in an extension direction perpendicular to the word line structure; the avoidance region comprises the concave region;
wherein a top surface of the concave region is aligned with a top surface of the second word line structure part in a direction perpendicular to a top surface of the semiconductor substrate;
in the direction perpendicular to the top surface of the semiconductor substrate, a bottom surface of the concave region is higher than a bottom surface of the second word line structure part, and a bottom surface of the first word line structure part is lower than a bottom surface of the second word line structure part;
wherein the word line structure comprises: a gate oxide layer and word lines; wherein the gate oxide layer covers a side wall of the word line trench; and the gate oxide layer is positioned between the word lines and the word line trench:
a word line in the first word line structure part is a solid structure;
in the first word line structure part, a top surface of the word lines is lower than a top surface of the gate oxide layer; and
in the first word line structure part, a respective word line serves as a bottom of the concave region, and the gate oxide layer disposed on the side wall of the word line trench serves as a side wall of the concave region.

2. The semiconductor device of claim 1, wherein
the concave region is positioned in a respective word line in the first word line structure part.

3. The semiconductor device of claim 2, wherein the gate oxide layer in contact with the second word line structure part is in direct contact with the semiconductor substrate; and
a shallow trench isolation layer is disposed between the gate oxide layer in contact with the first word line structure part and the semiconductor substrate.

4. The semiconductor device of claim 1, wherein the gate oxide layer in contact with the second word line structure part is in direct contact with the semiconductor substrate; and
a shallow trench isolation layer is disposed between the gate oxide layer in contact with the first word line structure part and the semiconductor substrate.

5. The semiconductor device of claim 1, wherein the insulating material comprises at least one of air or inorganic insulating material.

6. The semiconductor device of claim 1, wherein the first word line trench has a larger depth than that of the second word line trench in a direction perpendicular to a plane on which the semiconductor substrate is positioned.

7. A manufacturing method of a semiconductor device, comprising:
providing a semiconductor substrate;
forming shallow trench isolation regions on the semiconductor substrate, and defining, by the shallow trench isolation regions, multiple active regions arranged at intervals;
forming a word line trench intersecting with corresponding active regions on the semiconductor substrate; wherein the word line trench comprises a first word line trench and a second word line trench; an orthographic projection of the first word line trench on the semiconductor substrate is positioned within an orthographic projection of a respective shallow trench isolation region on the semiconductor substrate; and an orthographic projection of the second word line trench on the semiconductor substrate is positioned within an orthographic projection of a respective active region on the semiconductor substrate; and
forming an embedded word line structure in the word line trench; wherein the word line structure comprises a first word line structure part and a second word line structure part electrically connected to each other; the first word line structure part is formed in the first word line trench, and the second word line structure part is formed in the second word line trench; and the first word line structure part comprises an avoidance region, a top surface of the avoidance region is aligned with a top surface of the second word line structure part, and the avoidance region is provided with insulating material;
wherein forming the embedded word line structure in the word line trench comprises:
covering a gate oxide layer on a side wall of the word line trench;
forming initial word line structure by filling conductive materials in the word line trench in which the gate oxide layer is formed;
etching the initial word line structure to enable a top surface of the initial word line structure to be lower than a top surface of the semiconductor substrate, so as to form the second word line structure part and first initial word line structure part positioned in the first word line trench; and
etching the first initial word line structure part to form the avoidance region in the first initial word line structure part, so as to form the first word line structure part; and
after forming the embedded word line structure in the word line trench, the manufacturing method further comprises: forming an insulating barrier layer covering the entire semiconductor device, and filling the avoidance region with insulating material;
wherein forming the insulating barrier layer covering the entire semiconductor device, and filling the avoidance region with insulating material comprises:
forming the insulating barrier layer covering the entire semiconductor device, and filling the avoidance region of the first word line structure part with the insulating barrier layer.

8. The manufacturing method of claim 7, wherein forming the word line trench intersecting with the corresponding active regions on the semiconductor substrate comprises:
forming the first word line trench in a respective shallow trench isolation region; and
forming the second word line trench in a respective active region.

9. The manufacturing method of claim 7, wherein forming the insulating barrier layer covering the entire semiconductor device, and filling the avoidance region with insulating material comprises:
forming the insulating barrier layer covering the entire semiconductor device, and forming an air gap in the avoidance region of the first word line structure part.

10. A semiconductor memory device comprising a semiconductor device, the semiconductor device comprises:
a semiconductor substrate, comprising: shallow trench isolation regions, and multiple active regions that are arranged at intervals and defined by the shallow trench isolation regions;
a word line trench formed on the semiconductor substrate, the word line trench being disposed to intersect with corresponding active regions; wherein the word line trench comprises a first word line trench and a second word line trench; an orthographic projection of the first word line trench on the semiconductor substrate is positioned within an orthographic projection of a respective shallow trench isolation region on the semiconductor substrate; and an orthographic projection of the second word line trench on the semiconductor substrate is positioned within an orthographic projection of a respective active region on the semiconductor substrate; and a word line structure embedded in the word line trench; wherein the word line structure comprises a first word line structure part and a second word line structure part connected to each other; the first word line structure part is formed in the first word line trench, and the second word line structure part is formed in the second word line trench;

wherein the first word line structure part comprises an avoidance region, a top surface of the avoidance region is aligned with a top surface of the second word line structure part, and the avoidance region is provided with insulating material;

wherein the word line structure comprises: a gate oxide layer and word lines; the gate oxide layer covers a side wall of the word line trench, the gate oxide layer is positioned between the word lines and the word line trench; and a concave region is positioned in a respective word line in the first word line structure part.

11. The semiconductor memory device of claim 10, wherein the second word line structure part is a solid structure; a cross section of the first word line structure part comprises the concave region in an extension direction perpendicular to the word line structure; and the avoidance region comprises the concave region.

12. The semiconductor memory device of claim 11, wherein a top surface of the concave region is aligned with a top surface of the second word line structure part in a direction perpendicular to a top surface of the semiconductor substrate; and in the direction perpendicular to the top surface of the semiconductor substrate, a bottom surface of the concave region is higher than a bottom surface of the second word line structure part, and a bottom surface of the first word line structure part is lower than the bottom surface of the second word line structure part.

13. The semiconductor memory device of claim 11, wherein the word lines comprise a first conductive film layer and a second conductive film layer; the first conductive film layer is disposed on the side wall of the word line trench, and the first conductive film layer is positioned between the second conductive film layer and the gate oxide layer; and the concave region is positioned in the second conductive film layer in the first word line structure part; or the second conductive film layer in the first word line structure part is a solid structure; in the first word line structure part, a top surface of the second conductive film layer is lower than a top surface of the first conductive film layer, the second conductive film layer serves as a bottom of the concave region, and the first conductive film layer disposed on the side wall of the word line trench serves as a side wall of the concave region.

* * * * *